United States Patent
Wang

(10) Patent No.: US 6,214,682 B1
(45) Date of Patent: Apr. 10, 2001

(54) METHOD FOR FABRICATING AN ULTRA-SHALLOW JUNCTION WITH LOW RESISTANCE USING A RAPID THERMAL ANNEAL IN AMMONIA TO INCREASE ACTIVATION RATIO AND REDUCE DIFFUSION OF LIGHTLY DOPED SOURCE AND DRAIN REGIONS

(75) Inventor: Jyh-Haur Wang, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/320,760

(22) Filed: May 27, 1999

(51) Int. Cl.$^7$ .................................................. H01L 21/336
(52) U.S. Cl. ........................................... 438/301; 438/305
(58) Field of Search ..................... 438/163, 262, 438/273, 278, 298, 301, 305, 791, 307

(56) References Cited

U.S. PATENT DOCUMENTS

| | | | |
|---|---|---|---|
| 5,296,411 | * | 3/1994 | Gardner et al. ...................... 437/238 |
| 5,525,296 | * | 6/1996 | Guldi ..................................... 437/28 |
| 5,605,854 | * | 2/1997 | Yoo ........................................ 437/44 |
| 5,736,446 | * | 4/1998 | Wu ....................................... 438/301 |
| 5,792,699 | * | 8/1998 | Tsui ..................................... 438/290 |
| 5,960,322 | * | 9/1999 | Xiang et al. ......................... 438/791 |
| 5,994,747 | * | 11/1999 | Wu ....................................... 257/408 |
| 6,008,098 | * | 12/1999 | Pramanick et al. .................. 438/305 |
| 6,022,785 | * | 2/2000 | Yeh et al. ............................. 438/305 |

OTHER PUBLICATIONS

Privitera et al., "Role of Surface and of Dopang–Impurity Interactions of the Electrical Activation of B Implants in Crystalline Si", Applied Physics Letters, vol. 72, No. 23, Jun. 1998, pp. 3011–3013.*

Chao et al., "Species and Dose Dependence of Ion Implantation Damage Induced Transient Enhanced Diffusion".*

Journal of Applied Physics 79(5) Mar. 1996, pp. 2352–2363.*

Zhang et al., "Transient Enhanced Diffusion Without {311} Defects in Low Energy B+ –Implanted Silicon", Applied Physics Letters, vol. 67, No. 14, Oct. 2, 1995, pp. 2025–2027.*

Segawa et al., A 018$\mu$m Ti–Salicided p–MOSFET with Shallow Junctions Fabricated by Rapid Thermal Processing in an $NH_3$ Ambient, IEDM 96, pp. 443–446.*

Downey et al., "RTP Requirements for Annealing Ultra–Shallow Junctions", Varian–Report No. 298, Apr. 1997.*

* cited by examiner

Primary Examiner—David Nelms
Assistant Examiner—Dung A Le
(74) Attorney, Agent, or Firm—George O. Saile; Stephen B. Ackerman; William J. Stoffel

(57) ABSTRACT

The invention provides a method for fabricating ultra-shallow lightly doped source and drain regions. A screen oxide layer is formed on a substrate having a gate thereon. Impurity ions are implanted into the substrate through the screen oxide layer to form lightly doped source and drain regions adjacent to the gate. A post-implant anneal is performed on the lightly doped source and drain regions using a rapid thermal anneal in a nitrogen containing atmosphere. The nitrogen anneal injects vacancies into the lightly doped source and drain regions reducing diffusion which is dependent on intersticial ions and increasing the activation ratio by dissolving impurity ion complexes.

12 Claims, 3 Drawing Sheets

METHOD FOR FABRICATING AN ULTRA-SHALLOW JUNCTION WITH LOW RESISTANCE USING A RAPID THERMAL ANNEAL IN AMMONIA TO INCREASE ACTIVATION RATIO AND REDUCE DIFFUSION OF LIGHTLY DOPED SOURCE AND DRAIN REGIONS

BACKGROUND OF INVENTION

1) Field of the Invention

This invention relates generally to fabrication of semiconductor devices and more particularly to the fabrication of lightly doped source and drain regions for low resistance, ultra-shallow junctions.

2) Description of the Prior Art

As microelectronic device dimensions decrease, the need to produce ultra-shallow (<60 nm) junctions with low resistance becomes essential. However, conventional ion implantation and annealing processes present several obstacles to formation of ultra-shallow lightly doped source and drain regions necessary for acheiving ultra-shallow junctions with low resistance.

One method of forming ultra-shallow lightly doped source and drain regions is to form a screen oxide layer, implant impurity ions through the screen oxide layer, then perform an anneal to drive in the impurity ions. The disadvantage of this process is that it is susceptible to oxygen enhanced diffusion (OED). OED causes "B" ions to diffuse deeper into the silicon substrate when a screen oxide is used even though the implant depth is shallower than without a screen oxide.

Another process used to form lightly doped source and drain regions is to perform an ion implant and pure $N_2$ drive in without using a screen oxide. This process does not suffer from OED. However, surface dopant loss occurs during the post implant anneal to drive in the impurity ions. Also, due to reduced gate oxide thicknesses associated with reduced scale devices, the lack of a screen oxide can cause gate oxide integrity degradation due to implantation damage.

An alternate approach is to form a screen oxide, perform impurity ion implantation, strip the screen oxide, then anneal to drive in the impurity ions. Since the screen oxide is removed prior to anneal, this process also suffers from surface dopant loss. Although the screen oxide prevents gate oxide degradation due to implantation damage, oxide stipping can also degrade the gate oxide integrity.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,525,529 (Guldi) discloses forming a source and drain region using a screen oxide or screen oxynitride blocking layer and an $NH_3$ anneal after ion implantation.

U.S. Pat. No. 5,604,854 (Yoo) and U.S. Pat. No. 5,792,699 (Tsui) teach standard LDD anneals.

U.S. Pat. No. 5,296,411 (Gardner et al.) shows a nitridation process to produce reliable oxides.

The following technical literature also provide information on relevant technical developments.

Privitera et al., Role of Surface and of Dopant Impurity Interactions on the Electrical Activation of B implant in Crystalline Si, Applied Physics Letters, Vol. 72, No. 23, 8 June 1998, pp. 3011 to 3013, teaches that while transient enhanced diffusion (TED) decreases at lower implant energy (typical of LDD), activation ratio also decreases as at lower implant energy.

Chao et al., Spicies and Dose Dependence of I/I Damage Induced Transient Enhanced Diffusion, Journal of Applied Physics 79(5), Mar. 1, 1996, pp. 2352 to 2363, discloses implant species dependance of diffusion due to point defect and dopant impurity interactions, particularly dopant clustering. However, species dependance of diffusion is less significant for lower doses.

L. H. Zhang et al., Transient Enhanced Diffusion without {311} Defects in Low Energy B+ Implantation, Applied Physics Letters, Vol. 67, No. 14, Oct. 2, 1995, pp. 2025 to 2027, discloses that for low energy (4 KeV) low dose ($10^{14}$ $cm^{-2}$) TED diffusion occurs independent of anneal temperature, and apparently without 311 defects.

Segawa et al., A 0.18 $\mu$m Ti-Salicided p-MOSFET with Shallow Junctions Fabricated by Rapid Thermal Processing in an $NH_3$ Ambient, IEDM 96, pp. 443 to 446, discloses that nitrogen ions diffuse into the substrate at the projected range of B+ implantation for source/drain regions during rapid thermal processing in an $NH_3$ atmosphere, suppressing boron diffusion.

Downey et al., RTP Requirements for Annealing Ultra-Shallow Junctions, Varian—Report No. 298, teaches that while $BF_2$ shows dopant loss at lower temperature than B (950° C. vs. 1050°) that $BF_2$ is preferable for shallow junctions reducing the junction depth by 428 Å compared to B.

SUMMARY OF THE INVENTION

It is an object of the present invention to provide a method for fabricating ultra-shallow lightly doped source and drain regions having low resistance.

It is another object of the present invention to provide a method for fabricating ultra-shallow lightly doped source and drain regions which reduces transient enhanced diffusion (TED).

It is another object of the present invention to provide a method for fabricating ultra-shallow lightly doped source and drain regions which prevents surface dopant loss.

It is another object of the present invention to provide a method for fabricating ultra-shallow lightly doped source and drain regions with a high activation ratio.

It is yet another object of the present invention to provide a method for fabricating ultra-shallow lightly doped source and drain regions which prevents gate oxide integrity degradation.

To accomplish the above objectives, the present invention provides a method for fabricating ultra-shallow lightly doped source and drain regions (14,16). The process begins by providing a substrate (10) having a gate (11) thereon. A screen oxide layer (12) is formed on the substrate (10). P-type impurity ions are implanted into the substrate (10), through the screen oxide layer (12) to form lightly doped source and drain regions (14, 16) adjacent to the gate. A post-implant anneal is performed on the lightly doped source and drain regions (14, 16) using a rapid thermal anneal in a nitrogen containing atmosphere (e.g. NO, $N_2O$, $NH_3$) to drive in the impurity ions. The anneal in a nitrogen containing atmosphere introduces N ions into the substrate forming vacancies. The vacancies capture intersticial Silicon, reducing transient enhanced diffusion. The vacancies also help dissolve dopant complexes, increasing the activation ratio.

The present invention provides considerable improvement over the prior art. The ultra-shallow lightly doped source and drain fabrication method of the present invention can simultaneously reduce transient enhanced diffusion (TED) and increase the activation ratio. N ions are injected into the substrate in the source and drain regions during rapid thermal anneal in $NH_3$. The N ions form vacancies which recombine with interstitial silicon, suppressing TED. The vacancies also help to dissolve impurity ion and defect complexes increasing the activation ratio.

Another advantage of the present invention is that the screen oxide layer acts as a cap layer reducing surface dopant loss and gate oxide degradation during post-implant annealing. Surface dopant loss increases resistance in lightly doped source and drain regions. Gate oxide degradation lowers the threshhold voltage of the gate.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

Figure 4:
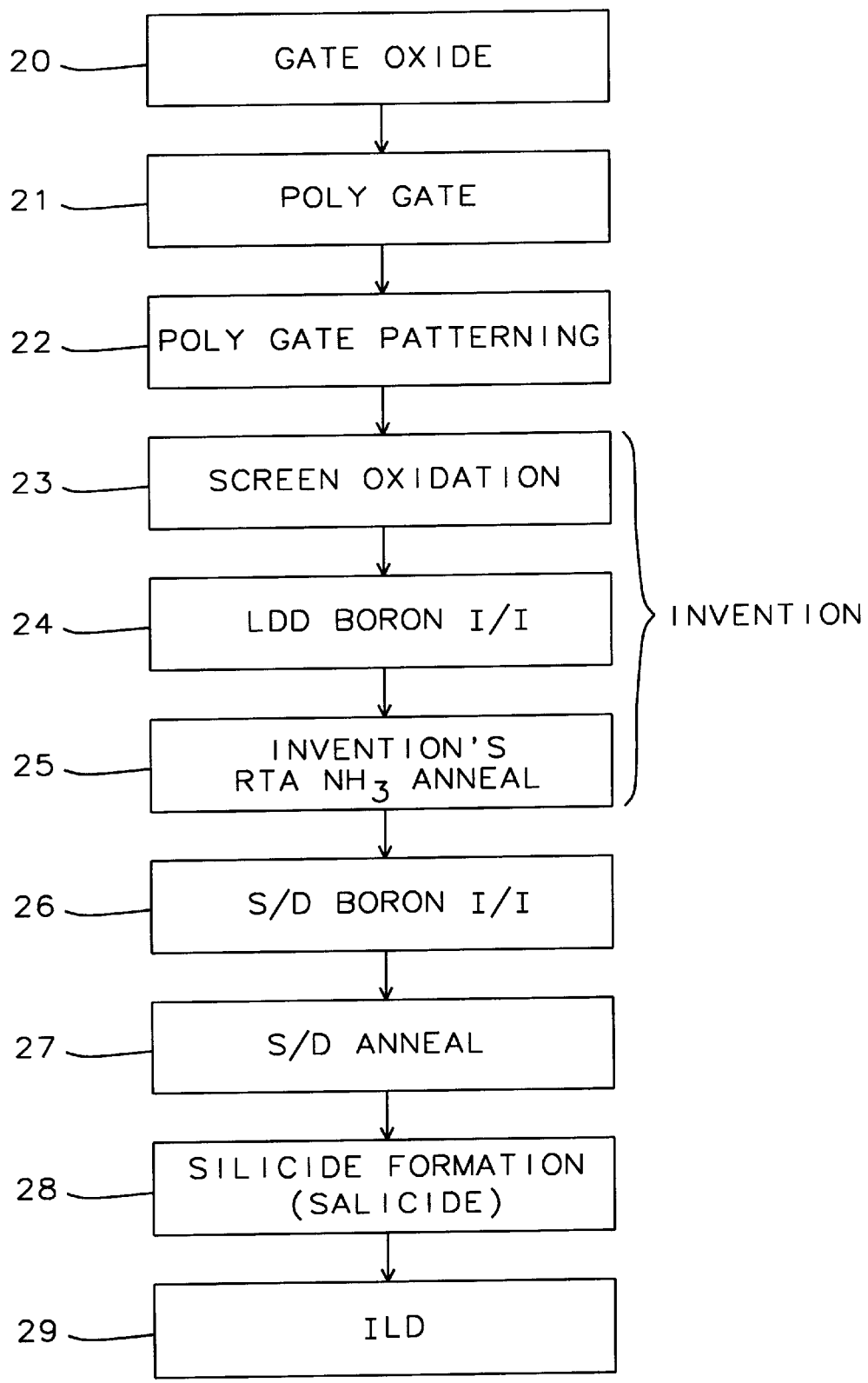
FIG. 4 shows the processing sequence for a lightly doped drain fabricated according to the present inventon.

The present invention will be described in detail with reference to the accompanying drawings. The present invention provides a method for fabricating ultra-shallow lightly doped source and drain regions, using the processing sequence steps (20 through 29) shown in FIG. 4.

Figure 1:
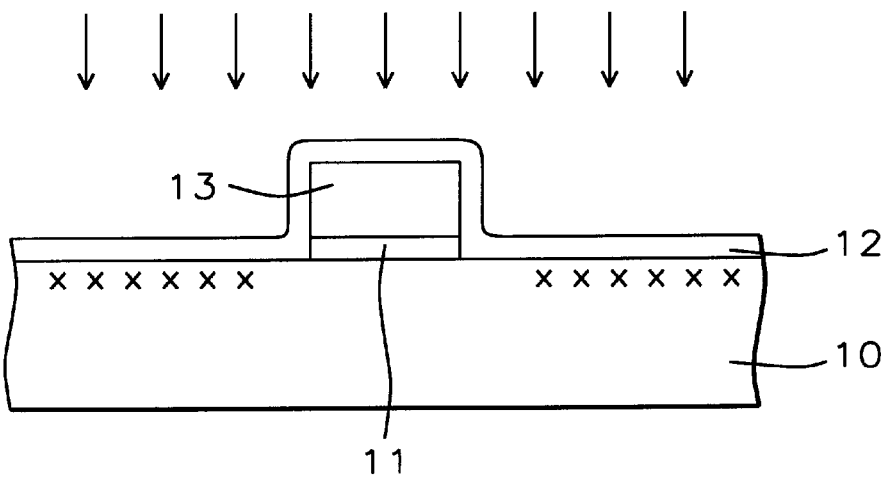
FIGS. 1 and 2 illustrate sequential sectional views of a process for fabricating ultra-shallow lightly doped source and drain regions according to the invention.

Referring to FIG. 1, the process begins by providing a substrate (10). The substrate, having already undergone some processing, has a gate oxide (11) and a gate electrode (13) thereon.

A screen oxide layer (12) is formed over the substrate (10). The screen oxide layer (12) is preferably formed by oxidation using a rapid thermal process at a temperature of between about 900° C. and 1000° C. for a time between about 20 seconds and 100 seconds. The screen oxide layer (12) preferably has a thickness of between about 20 angstroms and 70 angstroms. Alternatively, the screen oxide layer can be formed in a nitrogen containing atmosphere at a temperature of between about 900° C. and 1150° C. for a time of between 5 seconds and 300 seconds, resulting in the screen oxide layer (12) being composed of $Si_xO_yN_z$ (silicon oxynitride) having a thickness of between about 20 angstroms and 70 angstroms. The nitrogen containing atmosphere can be NO or $N_2O$.

Still referring to FIG. 1, impurity ions are implanted into the substrate (10), through the screen oxide layer (12) to form lightly doped source and drain regions (14, 16) adjacent to the gate oxide (11). The impurity ions can be $BF_2$ or B ions. The B impurity ions are preferably implanted at an energy of between about 0.2 KeV and 5 KeV and at a dose of between 1E13 $atm/cm^2$ and 1E15 $atm/cm^2$. The $BF_2$ impurity ions can be implanted at an energy of between 1 KeV and 10 KeV and at a dose of between 1E13 $atm/cm^2$ and 1E15 $atm/cm^2$.

An advantage of the present invention is that the screen oxide layer (12) prevents gate oxide degradation which can be caused by ion implant damage when no screen oxide layer is used.

Figure 2:
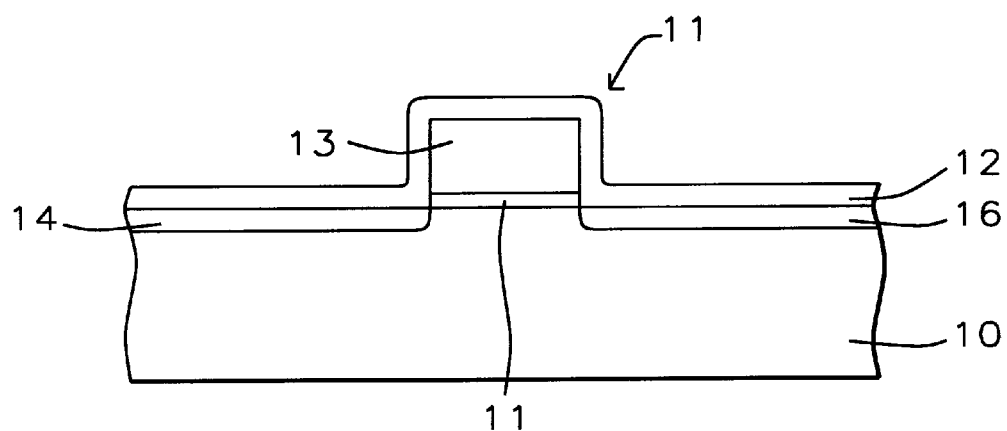

Referring to FIG. 2, a post-implant anneal is performed on the lightly doped source and drain regions (14, 16) to drive in the impurity ions. The post-implant anneal uses a rapid thermal anneal at a temperature of between 900° C. and 1050° C. for a time of between about 5 seconds and 30 seconds in a nitrogen containing atmosphere. The nitrogen containing atmosphere can be $NH_3$, NO, or $N_2O$, most preferably $NH_3$ in $N_2$. The flow ratio of $NH_3$ to $N_2$ is preferably between about 5% and 80%.

The key advantage of the present invention is that it can simultaneously reduce transient enhanced diffusion (TED) and increase the activation ratio, thereby forming low resistance, ultra-shallow lightly doped source and drain regions. N ions are injected into the substrate in the source and drain regions during rapid thermal anneal in $NH_3$. The N ions form vacancies which recombine with interstitial silicon, suppressing TED. The vacancies also help to dissolve impurity ion and defect complexes increasing the activation ratio.

Another advantage of the present invention is that the screen oxide layer acts as a cap layer reducung surface dopant loss during post-implant annealing. Surface dopant loss increases resistance in lightly doped source and drain regions.

Figure 3:
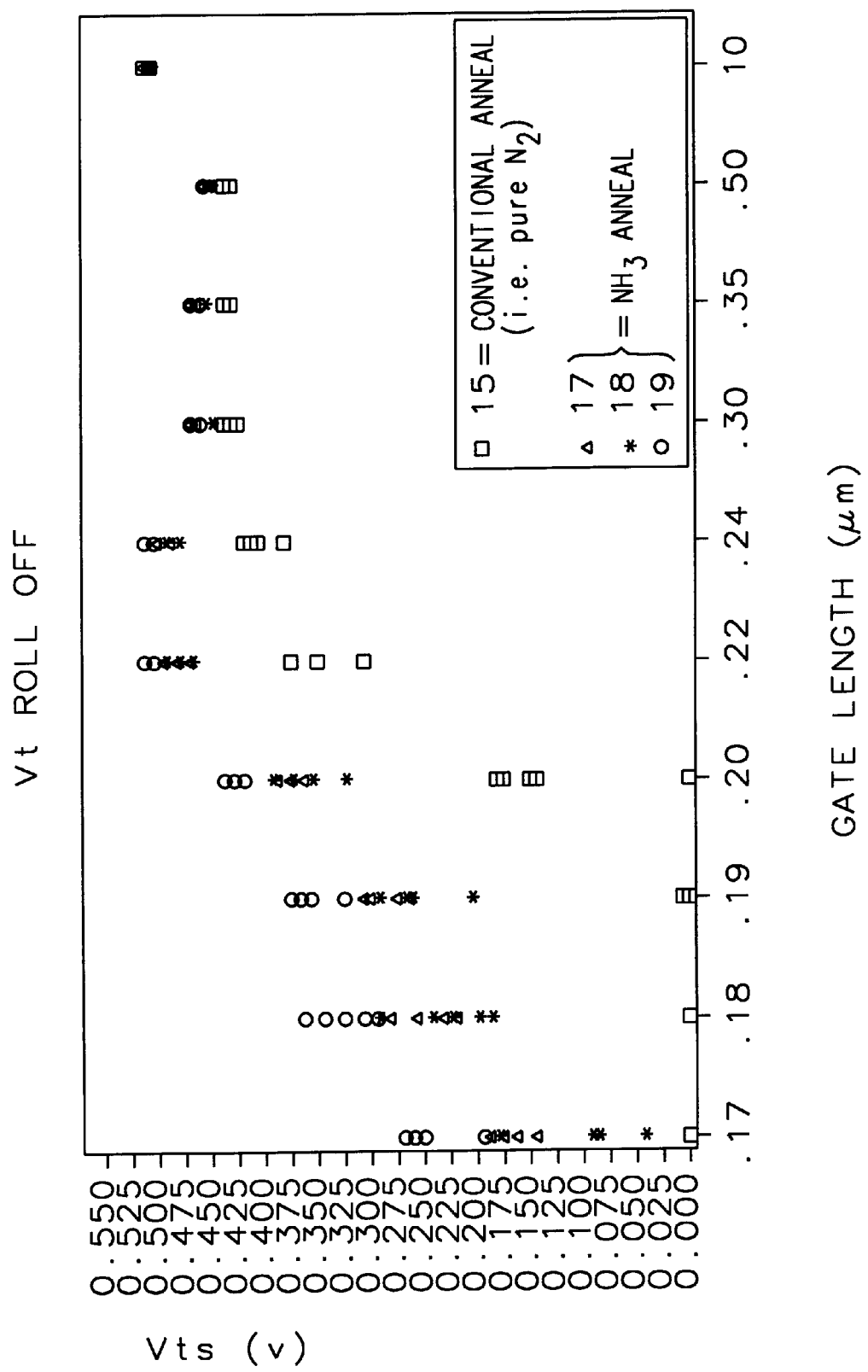
FIG. 3 shows a comparison of threshhold voltage (Vt) for a lightly doped drain fabricated according to the present invention and a conventional process, indicating a shallower junction.

The result of these improvements is a significant improvement in threshhold voltage (Vt) roll off as shown in FIG. 3. Since Vt roll off is the limiting factor for device scaling, the present invention provides an enhanced ability for device scaling.

While the invention has been particularly shown and described with reference to the preferred embodiments thereof, it will be understood by those skilled in the art that various changes in form and details may be made without departing from the spirit and scope of the invention.

What is claimed is:

1. A method for fabricating ultra-shallow lightly doped source and drain regions using a rapid thermal anneal in an ammonia containing atmosphere to drive in and activate implanted impurity ions consisting of the steps of:
   a. providing a substrate having a gate oxide and gate electrode thereon;
   b. forming a screen oxide layer on said substrate;
   c. implanting p-type impurity ions into said substrate, through said screen oxide layer to form lightly doped source and drain regions adjacent to said gate oxide; and
   d. performing a post-implant anneal on said lightly doped source and drain regions using a rapid thermal anneal in a nitrogen containing atmosphere.

2. The method of claim 1 wherein said screen oxide layer has a thickness of between about 20 angstroms and 70 angstroms.

3. The method of claim 1 wherein said impurity ions are boron ions implanted at an energy of between about 0.2 KeV and 5 KeV at a dose of between 1E13 atm/cm$^2$ and 1E15 atm/cm$^2$.

4. The method of claim 1 wherein said impurity ions are boron fluoride ions implanted at an energy of between 1 KeV and 10 KeV and at a dose of between 1E13 atm/cm$^2$ and 1E15 atm/cm$^2$.

5. The method of claim 1 wherein said post-implant anneal is performed in an atmosphere comprising $NH_3$ and $N_2$, at a temperature of between about 900° C. and 1050° C., for a time of between about 5 seconds and 30 seconds.

6. The method of claim 1 wherein said post-implant anneal is performed in an atmosphere comprising $NH_3$ and $N_2$ at a ratio of between 5 $NH_3$:95 $N_2$ and 80 $NH_3$:20 $N_2$, at a temperature of between about 900° C. and 1050° C., for a time of between about 5 seconds and 30 seconds.

7. The method of claim 1 wherein said post-implant anneal is performed in an atmosphere comprising NO or $N_2O$ and $N_2$, at a temperature of between about 900° C. and 1050° C., for a time of between about 5 seconds and 30 seconds.

8. A method for fabricating ultra-shallow lightly doped source and drain regions using a rapid thermal anneal in an ammonia containing atmosphere to drive in and activate implanted impurity ions consisting of the steps of:

a. providing a substrate having a gate thereon;

b. forming a screen oxide layer on said substrate;

c. implanting boron ions into said substrate, through said screen oxide layer to form lightly doped source and drain regions adjacent to said gate; and d. performing a post-implant anneal on said lightly doped source and drain regions using a rapid thermal anneal in a nitrogen containing atmosphere at a temperature of between about 900° C. and 1050° C., for a time of between about 5 seconds and 30 seconds.

9. The method of claim 8 wherein said screen oxide layer has a thickness of between about 20 angstroms and 70 angstroms.

10. The method of claim 8 wherein said impurity ions are implanted at an energy of between about 0.2 KeV and 5 KeV at a dose of between 1E13 atm/cm$^2$ and 1E15 atm/cm$^2$.

11. The method of claim 8 wherein said post-implant anneal is performed in an atmosphere comprising $NH_3$ and $N_2$, at a ratio of between 5 $NH_3$:95 $N_2$ and 80 $NH_3$:20 $N_2$.

12. The method of claim 8 wherein said post-implant anneal is performed in an atmosphere comprising NO or $N_2O$ and $N_2$.

* * * * *